United States Patent [19]

Koizumi et al.

[11] Patent Number: 4,586,012
[45] Date of Patent: Apr. 29, 1986

[54] SOLDERED SUPERCONDUCTIVE COILS FOR A PULSE MAGNET

[75] Inventors: Misao Koizumi, Kawasaki; Satoru Murase, Yokohama, both of Japan

[73] Assignee: Kabushiki Kaisha Toshiba, Kawasaki, Japan

[21] Appl. No.: 631,319

[22] Filed: Jul. 16, 1984

[30] Foreign Application Priority Data

Jul. 26, 1983 [JP] Japan ................. 58-135180

[51] Int. Cl.⁴ .............................. H01F 7/22
[52] U.S. Cl. ................. 335/216; 174/126 S
[58] Field of Search .......... 335/216; 174/126 S, 174/128 S; 29/599; 428/609, 660

[56] References Cited

U.S. PATENT DOCUMENTS

| | | | |
|---|---|---|---|
| 3,428,925 | 2/1969 | Bogner | 335/216 |
| 3,428,926 | 2/1969 | Bogner et al. | 335/216 |
| 3,983,521 | 9/1976 | Furuto et al. | 335/216 |
| 4,078,299 | 3/1978 | Furuto | 29/599 |

OTHER PUBLICATIONS

IEEE Transactions on Magnetics, vol. MAG-17, No. 5, Sep. 1981, pp. 1745-1748, New York, U.S.A.; K. P. Jungst et al.; Status Report of TESPE, *p. 1745, right--hand column, paragraphs 4, 5*.

Cryogenics, vol. 15, No. 11, Nov. 1975, pp. 675-677; K. Kuroda: "Superconducting Coils Impregnated with Wood's Metal".

Primary Examiner—George Harris
Attorney, Agent, or Firm—Oblon, Fisher, Spivak, McClelland & Maier

[57] ABSTRACT

A superconductor for a pulsed magnet has a wire assembly including a plurality of superconducting wires individually bonded with a solder. The solder consists of an Sn-Pb alloy containing indium and/or bismuth. When this solder is used, a coupling current induced between the superconducting wires can be reduced to an acceptable value.

3 Claims, 5 Drawing Figures

SOLDERED SUPERCONDUCTIVE COILS FOR A PULSE MAGNET

BACKGROUND OF THE INVENTION

The present invention relates to a superconductor for a pulsed magnet and, more particularly, to a superconductor for a pulsed magnet having a wire assembly consisting of a plurality of superconducting wires, or consisting of a plurality of superconducting wires and a plurality of normal conducting wires, wherein the wires are individually bonded by solder.

When a pulsed magnet is energized, an alternating current loss is generally produced in a superconductor constituting the pulsed magnet. In order to reduce such an alternating current loss, a pulsed magnet generally consists of a superconductor (stranded cable or braided cable) obtained by stranding or braiding a plurality of superconducting wires. In such a superconductor obtained by stranding or braiding a plurality of superconducting wires, the superconducting wires are bonded by solder with a low melting point in order to assure stable electrical and thermal characteristics of the wires and to improve the mechanical strength of the assembly.

Although solder must be used in a superconductor of the type described above, as may be seen from the above description, pulsed energization of the superconductor may result in a high coupling loss due to a coupling current induced in the solder layer. In order to reduce the coupling loss due to the coupling current, solder with high electrical resistivity must be used. In a conventional superconductor for a pulsed magnet, an Sn-Pb alloy having a relatively high electrical resistivity is used as a solder so as to reduce the coupling current.

FIG. 1 shows the electrical resistivity $\rho$ ($\Omega\cdot$cm) as a function of the Pb weight content (weight %) in the solder consisting of an Sn-Pb binary alloy. The data shown in FIG. 1 was obained by measurements made in liquid helium (4.2K) at an external magnetic field of 2 T (tesla). As can be seen from FIG. 1, the electrical resistivity of the solder consisting of an Sn-Pb alloy increases gradually until the Pb weight content in the alloy reaches about 90 wt %. However, the electrical resistivity decreases abruptly when the Pb weight content exceeds 90 wt %. The maximum electrical resistivity is as low as $5\times10^{-7}$ $\Omega\cdot$cm and is not satisfactory for reducing the coupling current.

In this manner, even if an Sn-Pb alloy is used for solder, a considerably high current is induced in the solder layer. Then, the coupling loss is increased, and the performance of the superconductor for a pulsed magnet is degraded. In view of this, a coupling solder is desired which has a higher electrical resistivity and which also has a low melting point and high mechanical strength at the extremely low temperatures needed for superconductivity.

SUMMARY OF THE INVENTION

It is an object of the present invention to provide a superconductor for a pulsed magnet, which is free from such problems as described above and which can reduce, to an acceptably low value, the coupling current induced between superconducting wires in a pulsed magnetic field.

In a superconductor for a pulsed magnet according to the present invention, a plurality of superconducting wires, or a plurality of superconducting wires and a plurality of normal conducting wires constituting a wire assembly, are individually bonded with solder. The solder consists of an Sn-Pb alloy containing at least one of indium and bismuth.

The amount of indium and/or bismuth to be contained in the Sn-Pb alloy is preferably not less than 0.4 wt % and more preferably falls within a range of 4 to 30 wt %. Although the composition of the Sn-Pb alloy is not particularly limited, the Pb weight content preferably falls within a range of 30 to 90 wt %.

The superconductor, wherein the wires are individually bonded with the solder as described above, can be prepared by impregnating the wires with the solder.

The superconductor for a pulsed magnet according to the present invention has various advantages such as a significant decrease in the coupling current induced between the superconducting wires in a pulsed magnetic field.

DETAILED DESCRIPTION OF THE PREFERRED EMBODIMENT

In a superconductor according to the present invention, a solder for bonding wires consists of an Sn-Pb binary alloy containing In and/or Bi. The solder consisting of such an Sn-Pb alloy will be described below.

Figure 1:
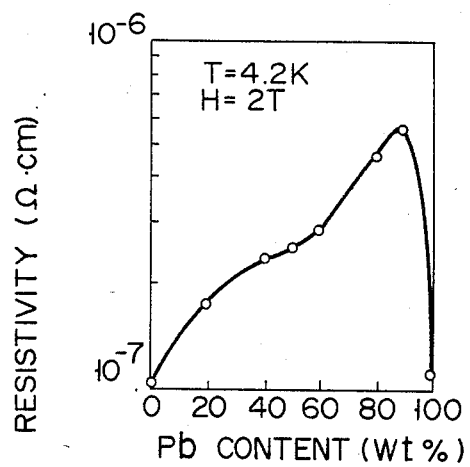
FIG. 1 is a graph showing the electrical resistivity as a function of Pb weight content of a solder consisting of a conventional Sn-Pb alloy.
Figure 2:
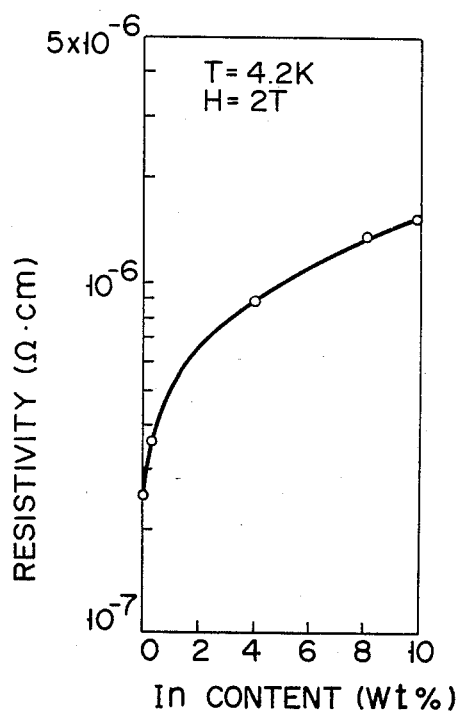
FIG. 2 is a graph showing the electrical resistivity as a function of In weight content of an Sn-Pb-In alloy to be used in a superconductor according to the present invention.

FIG. 2 is a graph showing the electrical resistivity as a function of the In weight content of a solder comprising an Sn-Pb binary alloy containing In as an additive. The electrical resistivity of the solder was determined in accordance with the following procedures.

99.9% pure Sn, 99.9% pure Pb and In were melted, and the molten mixture was worked to provide a solder wire having a diameter of 2 mm. The electrical resistivity of the wire was measured in liquid helium (4.2K) at an external magnetic field of 2 T. Similar measurements were performed for four types of solder wires consisting of an Sn-Pb(50%)-In(0.4%) alloy, an Sn-Pb(50%)-In(4%) alloy, an Sn-Pb(50%)-In(8%) alloy, and an Sn-Pb(50%)-In(10%) alloy.

As can be seen from FIG. 2, when the amount of In to be added in the Sn-Pb binary alloy is increased, the electrical resistivity of the alloy can be continuously and significantly increased. For example, when In is added to the alloy in the amount of 0.4%, the electrical resistivity of the alloy becomes about 1.5 times that of the Sn-Pb(50%) binary alloy. When In is added in the amount of 10%, the electrical resistivity of the resultant alloy becomes about 10 times that of the Sn-Pb(50%) binary alloy. In this manner, in a solder consisting of a conventional Sn-Pb binary alloy, the increase in the electrical resistivity obtainable with an increase in the Pb weight content is limited, and a desired electrical resistivity cannot be obtained. However, with a solder comprising an Sn-Pb binary alloy containing In as an additive, the electrical resistivity can be significantly increased.

Figure 3:
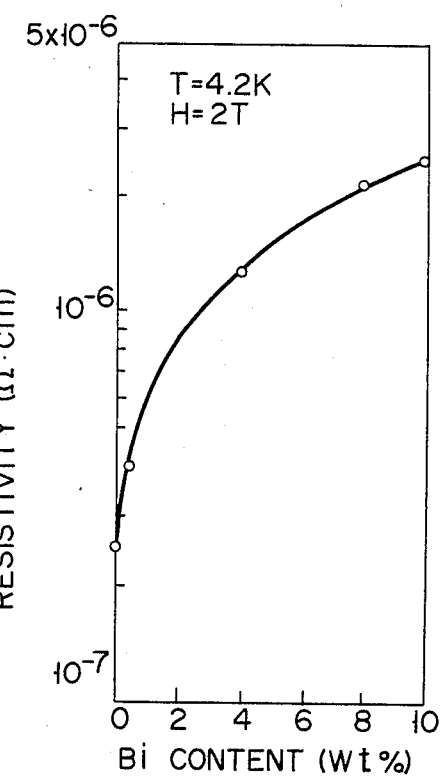
FIG. 3 is a graph showing the electrical resistivity as a function of Bi weight content of a Sn-Pb-Bi alloy to be used in a superconductor according to the present invention.

FIG. 3 shows electrical resistivity as a function of the Bi weight content of a solder comprising an Sn-Pb alloy containing Bi as an additive. The electrical resistivity was measured under the same conditions as those of FIG. 2. As is seen from FIGS. 2 and 3, substantially the same electrical resistivity can be obtained when Bi or In is added to the Sn-Pb binary alloy. It was also confirmed that addition of both Bi and In produces a similar result.

The results shown in FIGS. 2 and 3 also reveal that a desired electrical resistivity can be obtained when In and/or Bi is added in the amount of 0.4 wt % or more, based on the total content of the Sn-Pb binary alloy.

The present invention will now be described by way of its Example.

EXAMPLE

Figure 4:
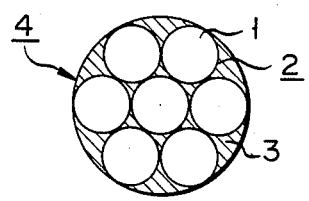
FIG. 4 is a cross-sectional view of an example of a superconductor according to the present invention.

Seven non-insulated Nb-Ti superconducting wires 1 having a diameter of 0.8 mm were stranded by stranding six wires around one central wire, as shown in FIG. 4, to provide a stranded superconductor 2 having a length of about 500 m. The stranded superconductor 2 was cut into lengths of about 100 m. Four out of five stranded superconductors 2 were impregnated with solders 3 respectively comprising an Sn-Pb(50%)-In(0.4%) alloy, an Sn-Pb(50%)-In(4%) alloy, an Sn-Pb(50%)-In(8%) alloy, and an Sn-Pb(50%)-In(10%) alloy. Thus, four types of superconductors 4, as shown in FIG. 4, were prepared. A superconductor of a Comparative Example was prepared with the remaining stranded superconductor 2 in a solder comprising an Sn-Pb(50%) binary alloy.

Figure 5:
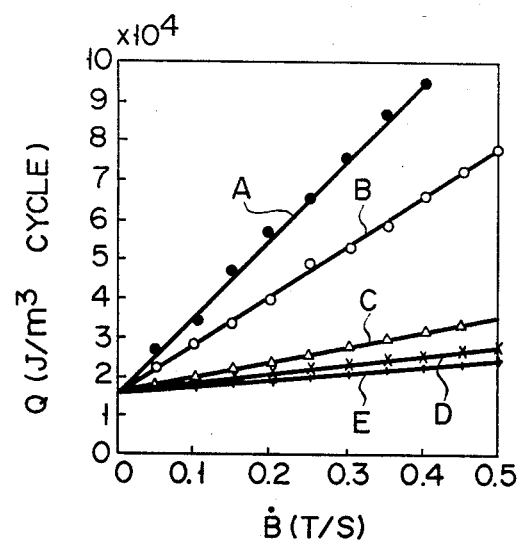
FIG. 5 is a graph showing alternating current loss as a function of the rate of change of the magnetic field density of a superconductor of the present invention together with the same of a conventional superconductor.

FIG. 5 shows the results of an alternating current loss obtained by the magnetizing measurement method for the four types of superconductors of the Example according to the present invention and that of the Comparative Example. More specifically, the graph shown in FIG. 5 shows the alternating current loss as a function of the rate of change $\dot{B}$ (T/sec) of a magnetic field when the rate of change of a pulsed magnetic field, applied vertically on the superconductor (changing 1 T→2 T→1 T), fell within the range of 0.05 T/sec to 0.5 T/sec. Referring to FIG. 5, the alternating current loss Q (J/m³ cycle) per unit volume of the superconductor and one cycle is plotted along the axis of ordinate, and the rate of change $\dot{B}$ (T/sec) of the magnetic field is plotted along the axis of abscissa. In FIG. 5, lines A, B, C, D and E respectively represent data obtained with the solders consisting of the Sn-Pb(50%) alloy, the Sn-Pn(50%)-In(0.4%) alloy, the Sn-Pb(50%)-In(4%) alloy, the Sn-Pb(50%)-In(8%) alloy and the Sn-Pb(50%)-In(10%) alloy.

As can be seen from FIG. 5, the alternating current loss Q (J/m³ cycle) increases with an increase in the rate of change $\dot{B}$ (T/sec) of the magnetic field. However, the magnitude of such an increase is smaller than that of the superconductor of the Comparative Example.

Among the superconductors of the present invention, the rate of increase in the alternating current loss with respect to a rate of change in the magnetic field is smaller when the In weight content is greater. The alternating current loss in a pulsed magnetic field as described above is the sum of the hysteresis loss (corresponding to the alternating current loss when $\dot{B}=0$ in FIG. 5) of the superconductor, which is independent of the rate of change of the magnetic field, and the coupling loss which is dependent on the rate of change of the magnetic field. In FIG. 5, the coupling loss increases with an increase in the rate of change in the magnetic field. In other words, in the superconductors of the Example of the present invention, the coupling loss is decreased in each case.

In the Example described above, the solder comprising an Sn-Pb alloy containing In was used. However, the present invention is not limited to this. Similar effects may also be obtained if a solder comprising an Sn-Pb alloy containing Bi or a solder comprising an Sn-Pb alloy containing both In and Bi is used.

The thermal and mechanical characteristics of the superconductors for pulsed magnets of the Example of the present invention were measured to be comparable to those of the superconductor of the Comparative Example.

In the Example described above, the Pb weight content in the alloy was 50%, which is generally the case in the alloys for solder of pulsed magnets. However, the Pb weight content can be varied. Furthermore, the structure of the superconductor is not particularly limited to that described above. That is, a superconducting wire to be used in a superconductor of the present invention may be coated with a normally conducting metal, and the superconductor of the present invention may comprise a plurality of superconducting wires and a plurality of normally conducting wires.

What is claimed is:

1. A superconductor for a pulsed magnet, comprising a wire assembly including a plurality of superconducting wires which are individually bonded with a solder, characterized in that said solder comprises an Sn-Pb alloy containing at least one additive metal selected from the group consisting of indium and bismuth, wherein said additive metal is contained in an amount falling within a range of 4 to 30 weight % based on a total weight of said solder.

2. A superconductor for a pulsed magnet according to claim 1, wherein said wire assembly further comprises a plurality of normal conducting wires.

3. A superconductor for a pulsed magnet according to claim 1, wherein said superconducting wires are coated with a normal conducting metal.

* * * * *